(12) United States Patent
Wade (10) Patent No.: US 9,213,066 B2
(45) Date of Patent: Dec. 15, 2015

(54) MULTIPLE CELL BATTERY VOLTAGE MEASUREMENT

(71) Applicant: John Manford Wade, Ramona, CA (US)

(72) Inventor: John Manford Wade, Ramona, CA (US)

( * ) Notice: Subject to any disclaimer, the term of this patent is extended or adjusted under 35 U.S.C. 154(b) by 191 days.

(21) Appl. No.: 14/099,956

(22) Filed: Dec. 8, 2013

(65) Prior Publication Data

US 2014/0167777 A1    Jun. 19, 2014

Related U.S. Application Data

(60) Provisional application No. 61/737,048, filed on Dec. 13, 2012.

(51) Int. Cl.
| | | |
|---|---|---|
| *G01N 27/416* | (2006.01) | |
| *H02J 7/00* | (2006.01) | |
| *G01R 31/36* | (2006.01) | |

(52) U.S. Cl.
CPC ........... *G01R 31/3606* (2013.01); *H02J 7/0018* (2013.01); *H02J 7/0093* (2013.01); *G01R 31/362* (2013.01)

(58) Field of Classification Search
CPC ........................ G01R 31/3606; G01R 31/3658
USPC .................................. 324/434, 426; 320/116
See application file for complete search history.

(56) References Cited

U.S. PATENT DOCUMENTS

| | | | |
|---|---|---|---|
| 4,079,303 A | 3/1978 | Cox | |
| 4,238,721 A | 12/1980 | Berman | |
| 5,047,915 A * | 9/1991 | Smith et al. .................. 363/161 |
| 5,747,968 A | 5/1998 | Hollandsworth | |
| 5,808,442 A | 9/1998 | Kaite | |
| 5,952,815 A | 9/1999 | Comte | |
| 6,377,024 B1 | 4/2002 | Choy | |
| 6,388,424 B1 | 5/2002 | Hidaka | |
| 6,400,124 B1 | 6/2002 | Hidaka | |
| 6,441,583 B1 | 8/2002 | Perelle | |
| 6,762,588 B2 | 7/2004 | Miyazaki | |
| 7,642,749 B2 | 1/2010 | Nishida | |
| 7,705,561 B2 | 4/2010 | Yano | |
| 7,808,207 B1 | 10/2010 | Chang | |
| 8,148,951 B2 | 4/2012 | Saito | |
| 8,427,099 B2 | 4/2013 | Wong | |
| 2009/0218986 A1 | 9/2009 | Jarvinen | |

(Continued)

FOREIGN PATENT DOCUMENTS

CN         2561154 Y      7/2003

*Primary Examiner* — M'baye Diao
(74) *Attorney, Agent, or Firm* — Yichuan Pan (57) ABSTRACT

A method and apparatus to detect cell voltage of each of a plurality of battery cells in a rechargeable battery pack is disclosed. The method comprises generating a wave form with a positive phase and a negative phase by a current limited square wave generator. The wave form is a square wave having a maximum peak-to-peak voltage when the square wave generator is not loaded to be current limited. Then, sending the positive phase of the wave form to a first loop from a capacitor to the positive side of a battery cell. And, sending the negative phase of the wave form to a second loop from the negative side of the battery cell toward the capacitor. Finally, detecting a change of an electrical signal from the square wave generator. The voltage detection method and apparatus of this invention can be applied to detect whether a rechargeable battery cell has voltage lower than a low voltage limit or to measure the voltage of the battery cell in order to check its status.

20 Claims, 6 Drawing Sheets

(56) References Cited

U.S. PATENT DOCUMENTS

| | | | |
|---|---|---|---|
| 2010/0164579 A1 * | 7/2010 | Acatrinei | 327/172 |
| 2012/0249071 A1 | 10/2012 | Yang | |
| 2012/0310562 A1 | 12/2012 | Lammeren | |
| 2013/0009593 A1 | 1/2013 | Takahashi | |

* cited by examiner

MULTIPLE CELL BATTERY VOLTAGE MEASUREMENT

CROSS REFERENCE TO RELATED APPLICATION

This is a 111A Application of Provisional Application Ser. No. 61/737,048, filed on Dec. 13, 2012, entitled CELL VOLTAGE MEASUREMENT MEANS FOR A MULTI CELL BATTERY PACK by John Manford Wade.

FIELD OF THE INVENTION

The present invention relates generally to battery charging and protection, and more particularly to voltage measurement for a plurality of rechargeable battery cells.

BACKGROUND OF THE INVENTION

Many battery powered products require the use of multiple cell battery packs with the cells connected in series to achieve a high enough voltage for proper operation. The rechargeable type of battery packs need to be recharged periodically so that the powered operation can continue. And, special care needs to be taken to avoid damage to the battery cells during charging and operation. Two typical damages to battery cells are overcharging and deep-discharging.

Overcharging may cause severe damages to battery cells, and may even become safety concerns. Overcharging lithium-ion or lithium polymer batteries, for example, may cause thermal runaway, and the high temperature developed may lead to cell rupture. Fire hazards have been reported during charging as extreme cases. Therefore, much attention has been paid to battery overcharging and solutions have been designed to avoid battery damage and safety issues. The typical charging system developed applies one charger to charge all cells connected in series in a battery pack. Since all cells are not manufactured the same, some cells may charge faster than others. As such, charging a battery pack with a plurality of cells with a single charger can lead to overcharging some of the cells.

U.S. Pat. No. 4,079,303, issued to Cox on Mar. 14, 1978, discloses a two step charging system to charge all battery cells connected in series at an initial charging rate to a predetermined voltage threshold, followed by an equalization procedure for charging each of the cells with controlled and equal voltage to fully charged state. The disadvantage of such a system is that the equalization phase is based on a conservative estimate of a predetermined charging voltage threshold. And the charging process can be time consuming when the battery pack contains many cells.

A common practice of using a single charger to charge a battery pack of a plurality of cells is to use shunt circuit to bypass the charging circuit of each individual cell when it is fully charged to avoid overcharging and over heat. U.S. Pat. No. 6,388,424B1, issued to Hidaka et al on May 14, 2002, teaches a system for charging a plurality of lithium-ion battery cells connected in series. And, each of the cells has a shunt circuit connected in parallel with the cell. A comparator compares the charging voltage of each cell with a reference voltage. When the charging voltage is higher than the reference voltage, a switch is activated to direct the electricity to the shunt circuit for the cell. Although the invention is trying to supply the surplus energy to the next cell in line, this system inevitably causes energy waste for charging which is not friendly to the environment.

Another damage that can happen to battery cells is deep-discharging. And this is especially true for lithium-ion and lithium polymer batteries. When a charged battery pack of a plurality of cells is connected to a load, each cell is gradually discharged, and the cell voltage declines. When a cell is discharged below a defined low voltage threshold, further discharging may damage it. After that, the cell may have degraded storage capacity. For example, a certain lithium-ion battery cell of the LiFePO4 variety should not be discharged below 2.5 volts to avoid deep-discharging damage. It is important, therefore, that care is taken to remove the battery load before the low cell voltage limit is reached.

Therefore, it is important to detect the voltages of the cells in a battery pack during charging or operation to effectively avoid over charging or deep-discharging. In a pack of a plurality of battery cells connected in series, cell voltage can be estimated by measuring the overall pack voltage and dividing it by the number of cells in the pack. This is only accurate, however, if the cells are nearly identical, which is rarely the case due to variations of components and manufacturing processes. It is apparently advantageous to measure the voltage of each of the plurality cells due to the type of uncertainties. This involves making differential voltage measurements in the presence of common mode voltages that are dependent on each individual cell's position in the pack. The measurement results are normally analog or digital signals that are referenced to a common voltage, typically the pack negative terminal. For a battery pack, there exist a predetermined high voltage limit and a predetermined low limit for each of the plurality of cells. During charging, a cell having its voltage reaching the predetermined high voltage limit will cause the charging of the cell to stop. During operation, any cell in the pack having voltage reduced to the predetermined low voltage limit will trigger load removal. For a battery pack of the LiFePO4 type cells, for example, a measurement of voltage below 2.5 volts for any cell in the pack will trigger the load removal. Since actual measurement of each cell is far superior to estimated voltage, cell damage due to overcharging and deep-discharging can be effectively avoided. Hence cell life is maximized and safety issues are prevented.

Many conventional ways exist to measure the voltage of each cell in a battery pack. Most of these approaches are expensive, mainly due to the large common mode voltages involved when there are many cells in the pack, and complex due to the wiring necessary to each cell. Therefore, there is a need for a simple and inexpensive way to detect voltage for each cell in a battery pack containing a plurality of cells.

SUMMARY OF THE INVENTION

It is therefore an object of the invention to provide a method and an apparatus to detect the voltage for each of a plurality of cells in a battery pack.

According to one aspect of the invention, the method of detecting a voltage of a rechargeable battery cell involves the following steps. First, generating a wave form with a positive phase and a negative phase by a current limited square wave generator. The wave form is a square wave having a maximum peak-to-peak voltage when the square wave generator is not loaded to be current limited. Then, sending the positive phase of the wave form to a first loop including a capacitor and the battery cell. The wave flows from the capacitor to the positive side of the battery cell. And, sending the negative phase of the wave form to a second loop including the capacitor. The negative wave flows from the negative side of the battery cell toward the capacitor. Finally, detecting a change of an electrical signal from the square wave generator. The electrical signal is a current limit indicator.

According to another aspect of the invention, the method of cell voltage detection is applied to detect whether a rechargeable battery cell has voltage lower than a low voltage limit by setting the maximum peak-to-peak voltage to a predetermined value according the low voltage limit.

According to yet another aspect of the invention, the method of cell voltage detection is applied to measure the voltage of a rechargeable battery cell by setting the maximum peak-to-peak voltage to a predetermined low value and incrementally increase the maximum peak-to-peak voltage while performing cell voltage detection.

According to yet another aspect of the invention, the current flow directions in the first electrical loop and in the second electrical loop is realized by diodes.

According to yet another aspect of the invention, the diodes in the measurement circuit are compensated for temperature changes during voltage detection.

BRIEF DESCRIPTION OF THE DRAWINGS

These and other objects and features of the invention will become more fully apparent from the following description and appended claims taken in conjunction with the following drawings, where like reference numbers and alphanumeric names indicate identical or functionally similar elements.

DETAILED DESCRIPTION OF THE INVENTION

The present description will be directed in particular to elements forming part of, or cooperating more directly with, methods and apparatus in accordance with the present invention. It is to be understood that elements not specifically shown or described may take various forms well known to those skilled in the art.

Figure 1:
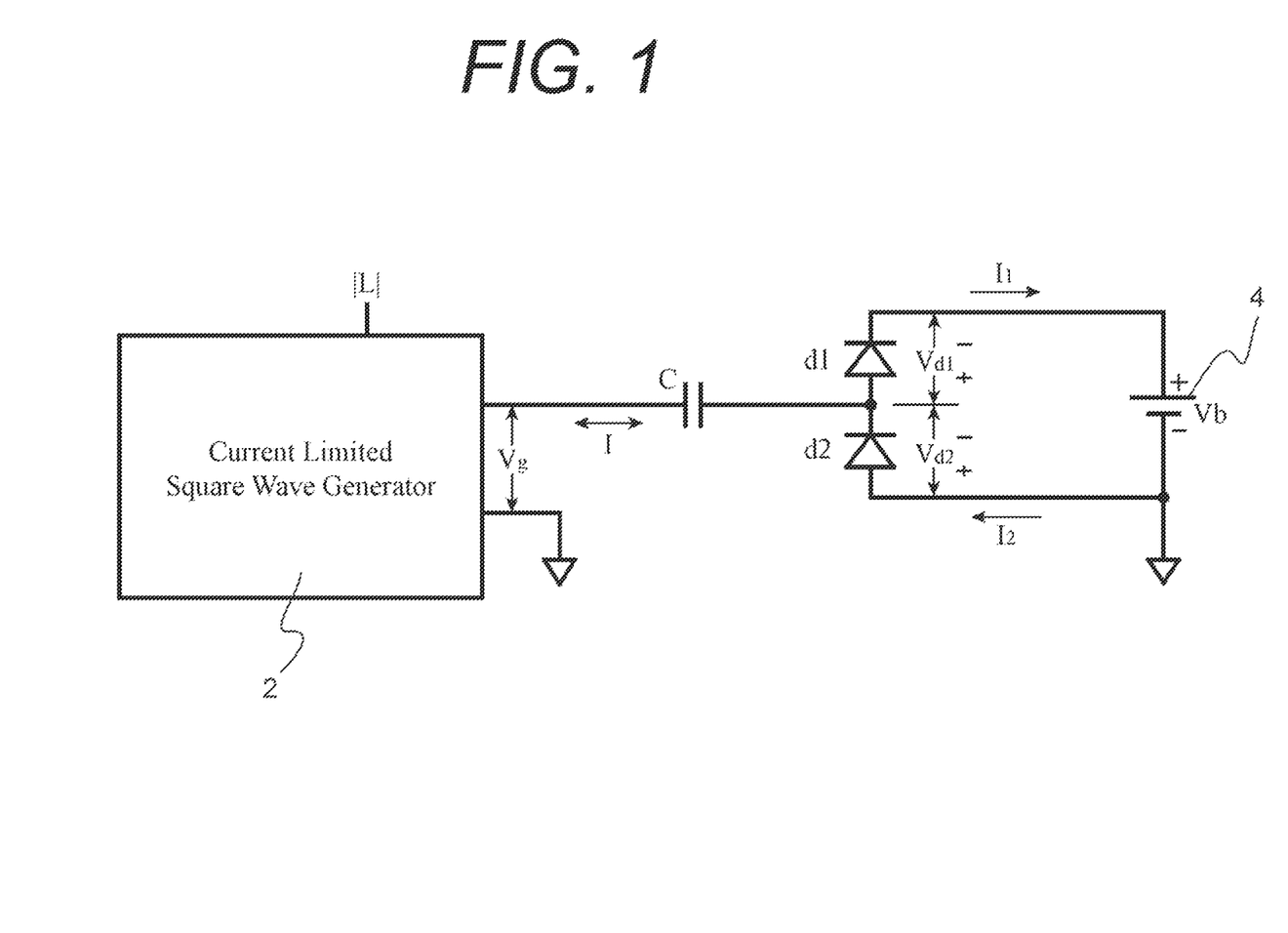
FIG. 1 is a schematic diagram of a voltage detection circuit connected to a battery cell.

FIG. 1 shows a circuit to detect the voltage of a battery cell. A current limited square wave generator 2 is connected to a battery cell 4 with voltage $V_b$. And, current limited square wave generator 2 and battery cell 4 are referenced to a common ground. Square wave generator 2 produces voltage wave form $V_g$ that has a series of waves with frequency F. Each wave has a positive phase and a negative phase, or a positive cycle and a negative cycle, with a peak-to-peak voltage amplitude $V_{g\text{-}pp}$. When square wave generator 2 is not loaded, the wave form $V_g$ is a square wave with maximum peak-to-peak voltage $V_{g\text{-}pp\text{-}max}$. When it is loaded enough to cause current limiting, wave form $V_g$ changes shape according to the load, and its amplitude $V_{g\text{-}pp}$ may be lower than $V_{g\text{-}pp\text{-}max}$. The circuit in FIG. 1 includes a capacitor C and two diodes d1 and d2 that separate the circuit to two current loops depending on the phase of wave form $V_g$ from square wave generator 2. When $V_b$ is low enough relative to $V_g$, and square wave generator 2 sends out a positive phase of a wave, electrical current $I=I_1$ travels in the direction from capacitor C through diode d1 to the positive side of battery cell 4. When a negative phase is sent, electrical current $I=I_2$ travels in the direction from the negative side of battery cell 4 through diode d2 to capacitor C. Diodes d1 and d2 can be replaced with other types of rectifiers that allow one way current flow.

The voltage of cell 4, $V_b$, can be measured for two distinctively different purposes: the first is to track the cell voltage to prevent overcharging during charging or to determine the status of the cell during operation; the second is to prevent deep-discharging during operation. The circuit of FIG. 1 can serve both purposes. During an operation when a battery pack is used to power a load (not shown), cell 4 is gradually discharged as energy is delivered to the load. Consequently, the voltage of cell 4, $V_b$, goes lower and lower. At a certain point, $V_b$ will decline to reach a predetermined low voltage limit $V_{b\text{-}low}$, below which damage to cell 4 can happen.

Square wave generator 2 has current limit indicator |L| that is high whenever the generator is current limited in either positive direction, wherein $I=I_1$ is greater than 0, or negative direction, wherein $I=I_2$ is greater than 0. In other words, limit indicator |L| being high is a signal that wave form $V_g$ from square wave generator 2 is current limited. Indicator |L| can be derived from electrical current I in FIG. 1. For example, an amplifier can be built into the circuit to take current I as input. In this way, even a small signal of I causes the amplifier to output a strong signal. Indicator |L| devised in such a way is a current indicator. Other implementations exist to produce the same output. As will be delineated in the next paragraphs, by measuring the change of indicator |L|, whether $V_b$ of cell 4 has reached the low voltage limit, $V_{b\text{-}low}$ can be detected. The low voltage limit detection can also be made with direct measurement of current I, or voltage $V_g$, with implementation of circuits known by those with ordinary skill in the art.

To detect whether $V_b$ of cell 4 has reached low voltage limit, $V_{b\text{-}low}$, the current limited maximum peak-to-peak voltage amplitude, $V_{g\text{-}pp\text{-}max}$, of the wave $V_g$ from generator 2 needs to be set to a predetermined value according to low voltage limit $V_{b\text{-}low}$ of cell 4, voltages across diodes d1 and d2, and voltage across capacitor C, as will be described subsequently.

Figure 2:
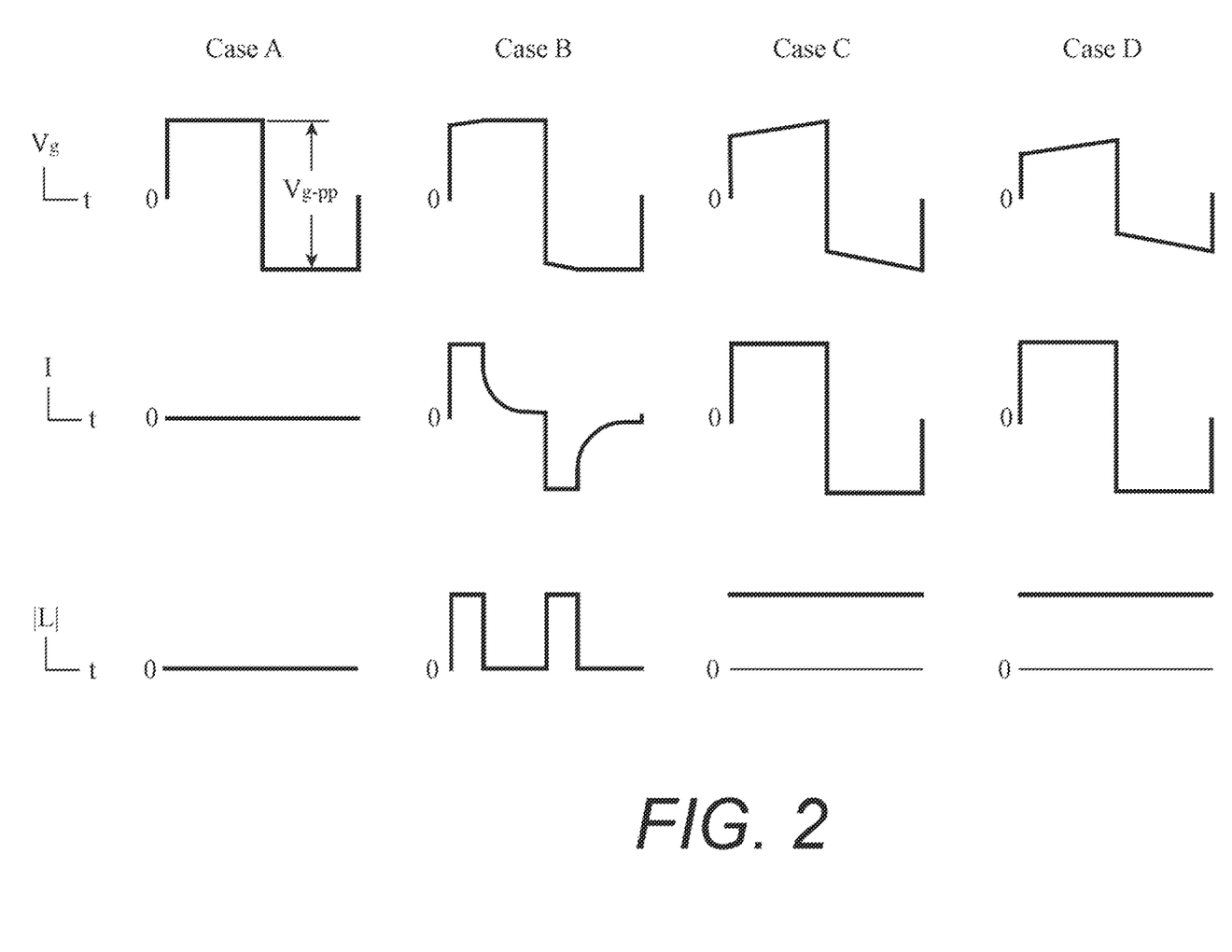
FIG. 2 is a series of charts showing electrical signals changing with time for 4 cases when applying the circuit in FIG. 1 for voltage detection.

According to FIG. 2, there are four states as voltage $V_b$ of cell 4 decreases and crosses low voltage limit $V_{b\text{-}low}$. They are Case A, Case B, Case C, and Case D, respectively. In FIG. 2, wave form $V_g$, current I, and indicator |L| are plotted as functions of time for the four different cases. In each of the four cases, steady state is assumed after capacitor C is initially charged.

For Case A, $V_b$ is substantially higher than the predetermined low voltage limit $V_{b\text{-}low}$. And, $V_b$ is even higher than maximum peak-to-peak voltage amplitude $V_{g\text{-}pp\text{-}max}$ of wave $V_g$. Therefore, diode d1 and diode d2 do not conduct and no current flows, that is, $I_1=I_2=0$ for the full period of $V_g$. As a result, square wave $V_g$ is undistorted. As shown in FIG. 2 as Case A, $V_g$ is a perfect square wave, because there is no current flow, i.e., I=0. Therefore, indicator |L| stays 0.

As cell 4 in FIG. 1 discharges and $V_b$ goes lower, to a certain point, $V_b$ will become somewhat lower than maximum peak-to-peak voltage $V_{g\text{-}pp\text{-}max}$. Then, Case B of FIG. 2 happens. At this point, diode d1 conducts for part of the positive cycle and diode d2 conducts for part of the negative cycle.

And the activities alternately add to and subtract from the capacitor's initial charge. When generator 2 is loaded by current flow for part of the positive cycle and part of the negative cycle, wave form $V_g$ cannot maintain its original square shape. And, generator 2 resorts to drive the load with its limited constant current, in partial positive or negative phases, in an effort to restore $V_g$ to its unloaded shape and value. The necessary voltage change across capacitor C for Case B is so small that it takes only part of half cycle to restore $V_g$ to its unloaded shape and value. Once $V_g$ reaches steady state, current I subsides, as shown in FIG. 2 as Case B. In this case, indicator |L| is high when current I has its limit current flowing during the time $V_g$ is ramping to its steady state value on each of the partial half cycles.

As cell 4 further discharges, $V_b$ goes lower further. Therefore, it takes longer for $V_g$ to reach steady state. To a certain point, the time it takes for $V_g$ to reach steady state is exactly the length of a half cycle of wave form $V_g$, hence Case C of FIG. 2. For Case C, generator 2 is not able to restore its unloaded voltage until at the end of each positive phase or negative phase. As a result, current $I=I_1$ stays constant for the entire positive phase of a wave as it flows through diode d1. And the same is true for the entire negative phase of the wave as current flows through diode d2 as $I=I_2$. The positive phase current $I=I_1$ and the negative phase current $I=I_2$ are equal in absolute value but opposite in flow direction from generator 2. Consequently, indicator |L| is constantly high for the full wave period for Case C.

Finally, for Case D, $V_b$ is lower still because cell 4 is further discharged. Current I flows during both half cycles, just as in Case C. The difference is that peak-to-peak amplitude $V_{g-pp}$ of wave form $V_g$, is reduced from that of Case C. This is because current I flowing through diode d1 in the positive cycle and through diode d2 in the negative cycle fails to fully recover $V_g$ to its stead state shape and value and to its maximum peak-to-peak voltage $V_{g-pp-max}$.

Considering the special properties of Case C, if $V_b$ is slightly higher than that of Case C, the limit current indicator |L| is either off or pulsing high for partial half cycle. When $V_b$ reaches the value of Case C, the pulsing stops and indicator |L| remains high. Since the transition of |L| from low, i.e., Case A, or partially low, i.e., Case B, to high, i.e., Case C, is detectable, |L| can be used for the detection of battery cell voltage $V_b$ being low. To make this detection a possibility, it is critical, then, to select electrical components C, d1 and d2, and a wave form $V_g$ having a matched maximum peak-to-peak voltage amplitude $V_{g-pp-max}$ and frequency.

Figure 3:
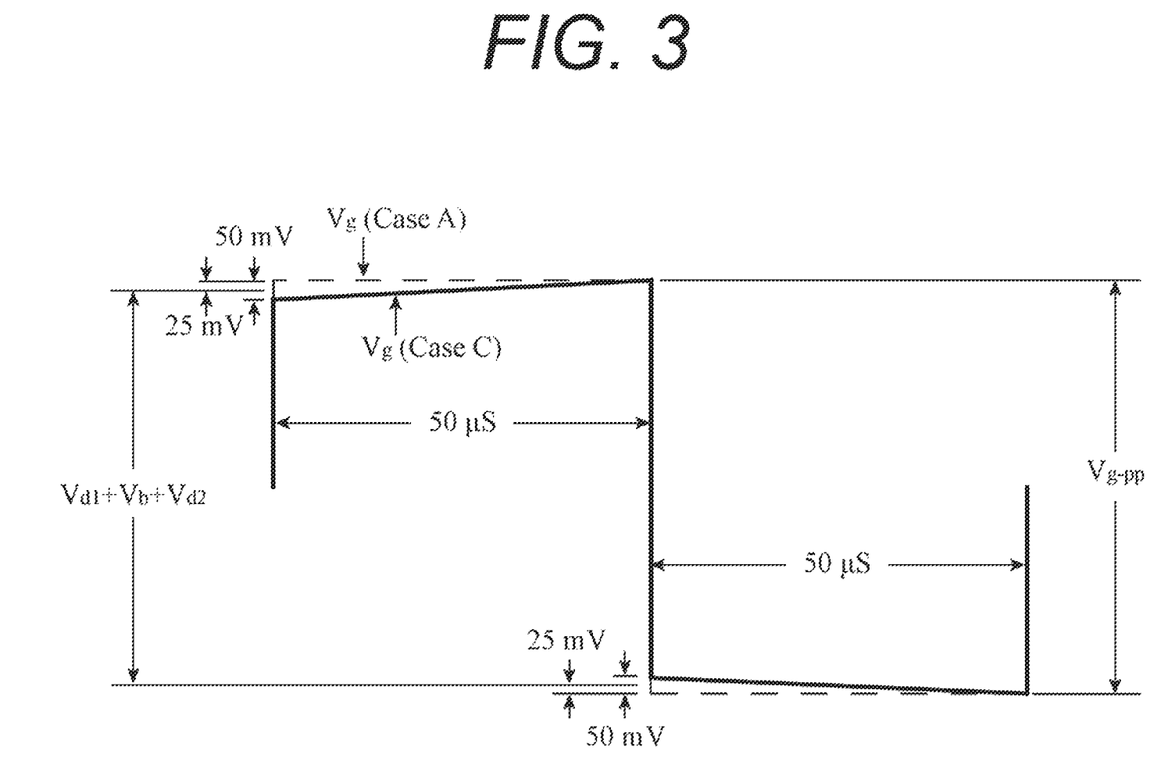
FIG. 3 shows a wave form of Case C in FIG. 2 for one full cycle, including the positive half cycle and the negative half cycle.

The following example, in connection with FIG. 3, numerically illustrates the selection of wave form $V_g$ and components C, d1 and d2 for the detection of voltage $V_b$ of cell 4 in FIG. 1 being low.

First, let's assume that the low voltage limit of cell 4 in FIG. 1 is $V_{b-low}$=2.8 V, and that operation temperature is 25° C. The limited current I is designed to be 1 mA. Since I is very small, it does not substantially affect the voltage of cell 4. The components of the circuit in FIG. 1 are selected as follows: capacitor C with capacitance of 1.00 μF; diode d1 and diode d2 with $V_{d1}=V_{d2}$=0.575 V (I=1 mA at 25° C.). Wave form V is set to have frequency F=10 KHz. The last parameter to decide is the value for maximum peak-to-peak voltage $V_{g-pp-max}$.

Since current I for Case C is constant on each of the positive and negative half cycles, the slope of the voltage ramp can be calculated as $$I/C = 1 \times 10^{-1} \times 10^{-6} = 10^3 \text{ V/S}.$$

Because the time for each half cycle is $\frac{1}{2}F = \frac{1}{2} \times (10^{-4})^{-1} = 50 \times 10^{-6}$ S, the voltage change on the half cycle ramp is $$(10^3 \text{ V/S}) \times (50 \times 10^{-6} \text{ S}) = 50 \text{ mV}.$$

As such, $V_{g-pp-max}$ should be equal to the summation of cell voltage $V_b$ plus the voltage drops at diodes d1 and d2 and 50 mV. In other words, $V_{g-pp}$ would be larger than the summation of cell voltage $V_b$ plus the voltage drop at diode d1 by 25 mV at the positive excursion of wave form $V_g$, and 25 mV below the summation of cell voltage $V_b$ plus the voltage drop at diode d2 at the negative excursion. This happens because capacitor C acquires whatever nominal charge necessary to make the positive and negative charge excursions equal. The capacitor therefore makes a +25 mV to −25 mV transition from its nominal charge on the first ramp, and the opposite on the second, so that each ramp traverses 50 mV. Therefore, the equation of voltage balance can be written as:

$$V_{g-pp-max} = V_{d1} + V_b + V_{d2} + 50 \text{ mV}.$$

And $$V_{g-pp-max} = 2.8 + 0.575 + 0.575 + 0.05 = 4.00 \text{ V}.$$

Therefore, to detect cell 4 of FIG. 1 against a low voltage limit $V_{b-low}$=2.8 V and with components selected in this example, a maximum peak-to-peak voltage $V_{g-pp-max}$=4.00 V is determined for wave form $V_g$.

The detection of voltage low for cell 4 in FIG. 1 follows the cases illustrated in FIG. 2. In an operation when cell 4 is loaded and discharged, voltage $V_b$ goes lower and lower. Initially $V_b$ is substantially above the low voltage limit $V_{b-low}$. And, current I from generator 2 and indicator |L| both stay low. This is Case A. At a certain point when $V_b$ is reduced close to low voltage limit $V_{b-low}$, Case B happens, where current I flows for part of each the half cycle and indicator |L| pulses. Further discharging of cell 4 leads to Case C. That is, current flows for full positive and negative cycles, and indicator |L| stays high all the time. At this point, voltage of cell for is detected to reach low voltage limit $V_{b-low}$.

The same circuit in FIG. 1 can be used for measuring of voltage $V_b$ of cell 4. Instead of setting maximum peak-to-peak voltage $V_{g-pp-max}$ to a determined value according to the parameters of components C, d1 and d2, and the predetermined low voltage limit $V_{b-low}$ for cell 4, $V_{g-pp-max}$ starts from a predetermined low value and incrementally increases during the detection process. The voltage detection process also follows the cases in FIG. 2. When $V_{g-pp-max}$ is lower than $V_b$, Case A of FIG. 2 happens. As $V_{g-pp-max}$ incrementally increases, at a certain point it is slightly above $V_{d1}+V_b+V_{d2}$. This leads to Case B, when current I from generator 2 flows for part of each the half cycle and indicator |L| pulses. Further increases $V_{g-pp-max}$ will trigger Case C shown in FIG. 2, where current flows for full positive and negative cycles, and indicator |L| stays high all the time. In this way, Case C is the detection of cell 4 voltage $V_b$. Using the assumptions and component selection of the above example, $V_b$ can be calculated as $$V_b = V_{g-pp-max} - V_{d1} - V_{d2} - 50 \text{ mV},$$

where $V_{g-pp-max}$ is the maximum peak-to-peak voltage of wave form $V_g$ when Case C happens.

The cell voltage detection capability provided by the method described above can produce battery status update based on actual measurements instead of estimates based on usage. When cell voltage is running low, an alert can be produced to warn the operator. And, when a cell in the battery pack malfunctions, for example, with low voltage or charging failure, warning can be produced to have the cell replaced.

For accurate detection, the forward voltage drops $V_{d1}$ and $V_{d2}$ of diodes d1 and d2 need to be specified for certain limited current used, for instance, the 1 mA as in the previous example. Fortunately tightly specified diodes are available inexpensively. One issue is that the temperature of the diodes is not always going to be 25° C. or at a fixed value. So temperature compensation is necessary for accurate measurement. One method of temperature compensation is to accurately measure the temperatures of diodes d1 and d2, and interpolate the true voltage drops $V_{d1}$ and $V_{d2}$ according to established voltage drop and temperature correlation. Diode voltage drop and temperature correlation can be provided by vendor or established in lab. Another method is to control the diode temperature to a narrow range during operation so that the diodes have constant voltage drops. Conventional methods for temperature control of electronics exist and can be selected and implemented by one of ordinary skill in the art.

A practical method of temperature compensation of diodes d1 and d2 in FIG. 1 is to match a pair of diodes in the circuit of square wave generator 2 so that voltage $V_{g\text{-}pp\text{-}max}$ is actually composed of a portion caused by diode temperature change. Ideally, the output voltage $V_g$ of wave generator 2 includes the voltage drops of two diodes identical to d1 and d2. In addition the matching diodes in wave generator 2 also have 1 mA of current flowing through and are at the same temperature as that of d1 and d2. In this way, when temperature changes, $V_{g\text{-}pp\text{-}max}$ will change with temperature the same amount that voltage drop $V_{d1}+V_{d2}$ changes, and the temperature effects on d1 and d2 are thereby compensated for. To maintain diodes d1 and d2 and their matching diodes in generator 2 at the same temperature, the 4 diodes can be physically placed at close vicinity or in contact with each other. Or, they can be thermally connected. In other words, they can be connected by a structure that has high thermal conductivity, or convective media, if there is a distance between them.

Figure 4:
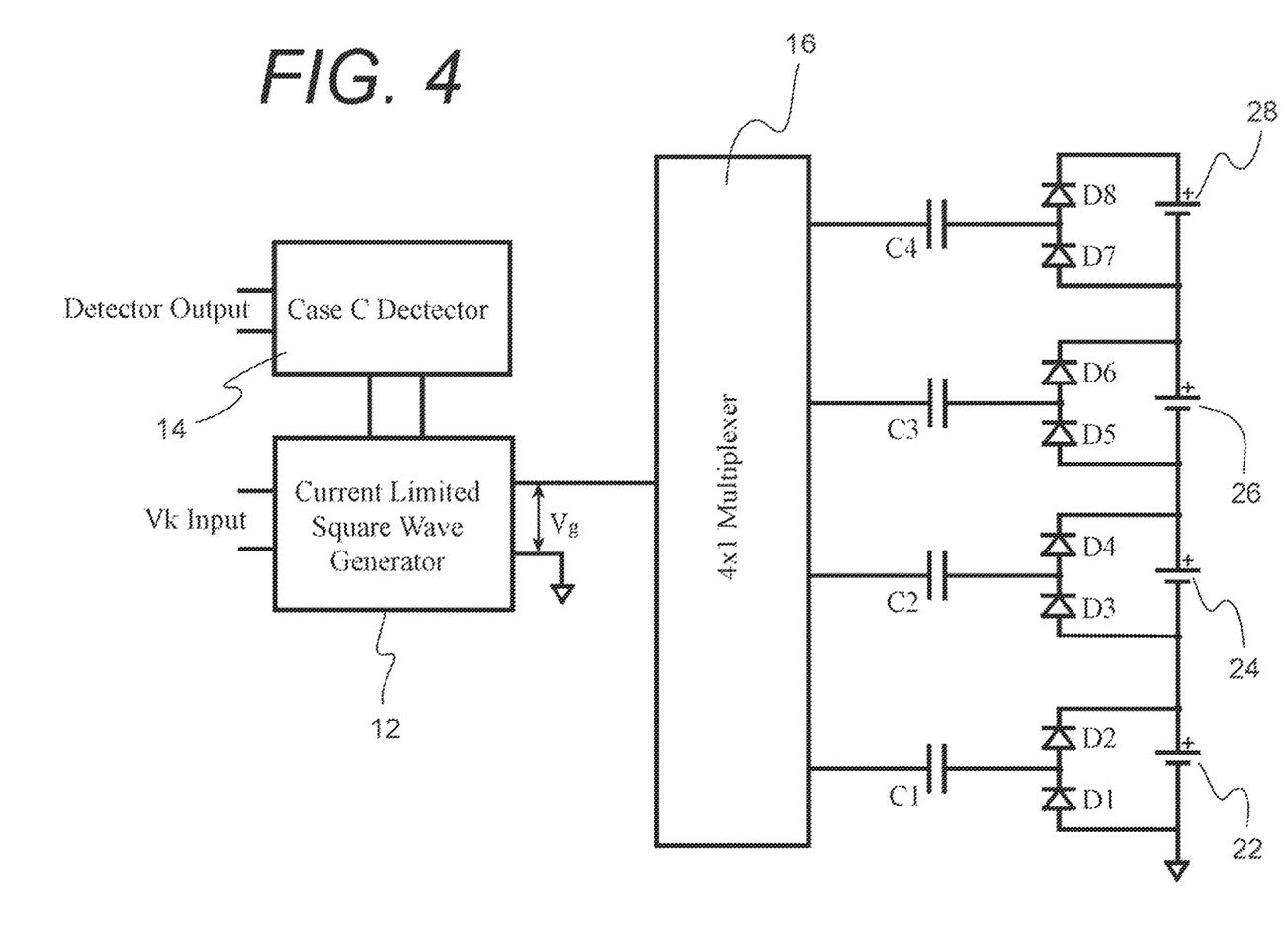
FIG. 4 is a schematic diagram of voltage detection of 4 battery cells connected in series, based on the circuit in FIG. 1.

Turning to FIG. 4, the voltage detection circuit of FIG. 1 is applied to detect voltages of 4 cells in a battery pack. Because the circuit for each cell is identical, the practice can be expanded to detect voltages of many cells in a battery pack, whether the cells are connected in series or in parallel. In practice, the limit to the number of cells in a battery pack is the voltage and current required for the operation, in addition to cost consideration. In FIG. 4, square wave generator 12 is shared by 4 circuits for the battery cells 22, 24, 26 and 28. Each circuit is connected to one battery cell at one end and to a common analog signal multiplexer 16 at the other end. Multiplexer 16 can include control logics or a processor that can manage multiple tasks. The wave signal from square wave generator 12 is manipulated by multiplexer 16 and sent to cells 22, 24, 26 and 28 sequentially. Each of the 4 circuits for voltage detection of individual cells 22, 24, 26 and 28 are identical to each other. That is, capacitors C1, C2, C3 and C4 are identical. And diodes D1 and D2 are identical to D3 and D4, to D5 and D6, and to D7 and D8.

FIG. 4 includes a Case C detector 14 to take indicator |L| and $V_{g\text{-}pp\text{-}max}$ as input and determine voltage detection according to the criteria described in previous paragraphs related to FIG. 1. When a predetermined maximum peak-to-peak voltage $V_{g\text{-}pp\text{-}max}$ is set according to cell low voltage limit, Case C detection of |L| high for a battery cell means that voltage of the battery cell has reached the low voltage limit. A decision will be made to remove the load (not shown) and stop the operation. When the detection process starts at a low $V_{g\text{-}pp\text{-}max}$ and incrementally increases, indicator |L| low means voltage for the cell being tested is not yet detected. And indicator |L| high, or Case C, means that that voltage of the battery cell is detected. Voltage for the cell is calculated according to the formula provided above. Since cell voltage normally changes slowly while being discharged with nominal currents, it is sufficient to sample it periodically rather than making continuous measurements. Therefore, sequenced and multiplexed measurements are suitable for most cell voltage measurement and low voltage detection purposes.

In FIG. 4, the capacitors and diodes can be located either near their respective cells. Or they can be placed remote from the cells but close to multiplexer 16. Since there are not many wires in the circuits, both cases are feasible. As disclosed previously, it's important to compensate the diodes for temperature change, in order to accurately detect cell voltage.

Figure 5:
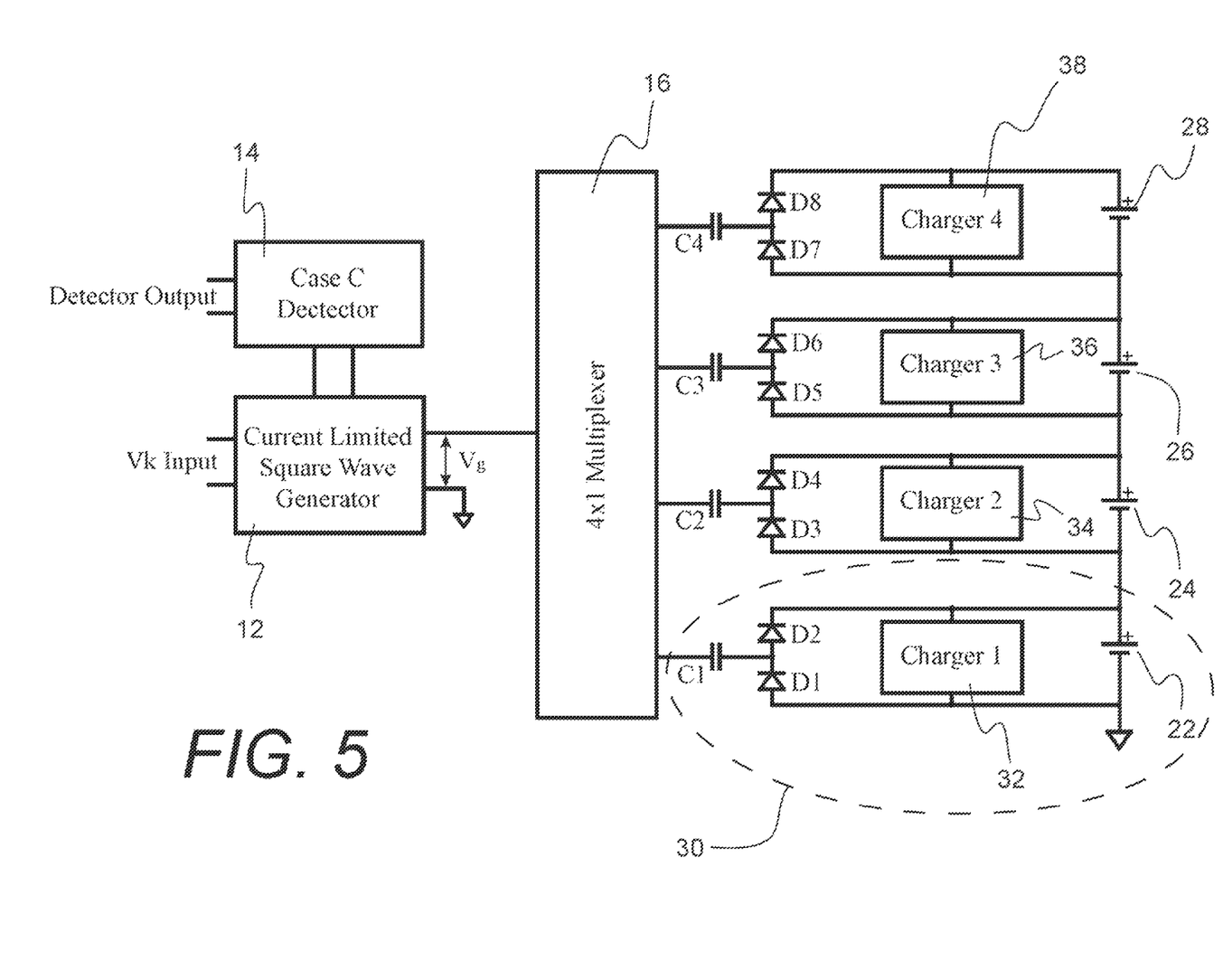
FIG. 5 is a schematic diagram of a voltage detection and charging circuit for 4 battery cells connected in series, based on the circuit in FIG. 4.

Now turning to FIG. 5, each individual voltage detection circuit in FIG. 4 is coupled with a battery charger. Four battery chargers 32, 34, 36 and 38 are used to charge battery cells 22, 24, 26 and 28, respectively. FIG. 5 shows that each battery charger has 2 wires to connect to its respective cell. But common wire sharing by adjacent chargers is possible. The charger can be a type of lithium-ion or lithium polymer battery charging device that is commercial available. Lithium-ion and lithium polymer batteries have high voltage limit above which damage to battery cell can happen. As such, battery chargers 32, 34, 36 and 38 preferably include their own circuits for detecting the battery charging state, manipulating charging rate when charging voltage approaches the high voltage limit, and ending charging when the high voltage limit is reached. Comparing with the voltage detection circuit of FIG. 4, the detection circuit included in a battery charger can has the advantage of manipulating and controlling the behavior of the charger.

The capacitors and the diodes of an each detection circuit in FIG. 5 can be located next to their coupled charger. For example, capacitor C1, diodes D1 and D2, and charger 32 can be placed in close vicinity or packaged together in the same housing. Further the detection and charging components can be placed close to battery cell 22. The voltage detection components and battery chargers of FIG. 5 can take other arrangements as optimal to battery pack integration.

Since the detection circuit and cell charger for each of the battery cells in FIG. 5 are simple and identical, it is possible to design and package them as a module. Such an embodiment is further depicted in FIG. 6, which is taken out of FIG. 5 as module 30 for cell 22. Module 30 contains voltage detection components C1, D1 and D2, and charger 32. Preferably, these components are standard components available from the market. They can be packaged closely together. For example, they can be assembled in a small housing on a mass production assembly line as an intermediate product. Though module 30 is taken out of FIG. 5 as connected to cell 22, it can be connected to any of the 4 cells because all the detection and charging modules are identical. During batten, pack integration, the number of modules 30 are selected to match the number of battery cells in the battery pack. Then each module 30 is connected to a battery cell. Since modules 30 are modularized and wiring is simple, no attention need to be paid to match module and cell. As such, the integration or assembly process is simple and can be error free. During operation when one module experiences an issue, it can be replaced without touching other modules in the same battery pack. Therefore, a modular device for voltage detection and battery charging, such as module 30 of FIG. 6, significantly reduces the complexity and greatly simplifies the integration and maintenance.

Module 30 can be further simplified by shared wiring of voltage detection and charging. For many applications, charging and discharging of a battery pack do not need to take place simultaneously. For example, for a battery powered vehicle, battery charging happens when the vehicle is stopped and connected to a charging station. At the time, it is proper to temporarily remove the load from the battery. And, the need for voltage detection is during battery in operation. This is especially true when battery chargers, such as many commercially available types, have the capability to detect battery voltage and control the charging process. In this case charger 32 in FIG. 6 includes a voltage detection circuit that senses the voltage of battery cell 22 and controls charger 32 during a charging event accordingly. As such, module 30 in FIGS. 5 and 6 only has two wires connecting to the cell, one ire to the positive side of the cell and the other to the negative side of the cell. And, the same wiring used for cell voltage detection by the detection circuit that includes capacitor C1 and diodes D1 and D2 is also used for charging: voltage detection happens during battery in operation; and charging happens when battery voltage is low and is not in operation. It can also be seen in FIGS. 5 and 6 that only 1 wire connects module 30 to shared multiplexer 16 because the circuit return to common is accomplished through the battery pack.

Figure 6:
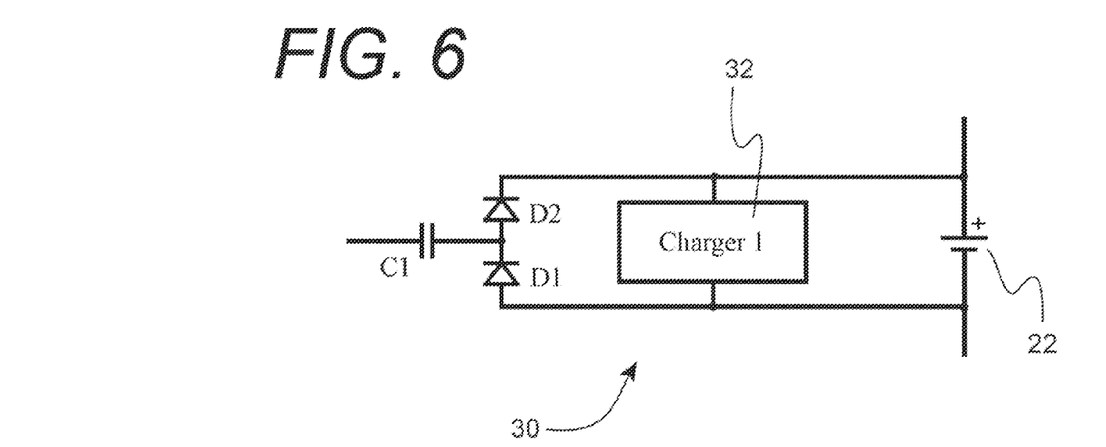
FIG. 6 is a schematic diagram of the voltage detection and charging module for a battery cell taking out of FIG. 5.
Figure 7:
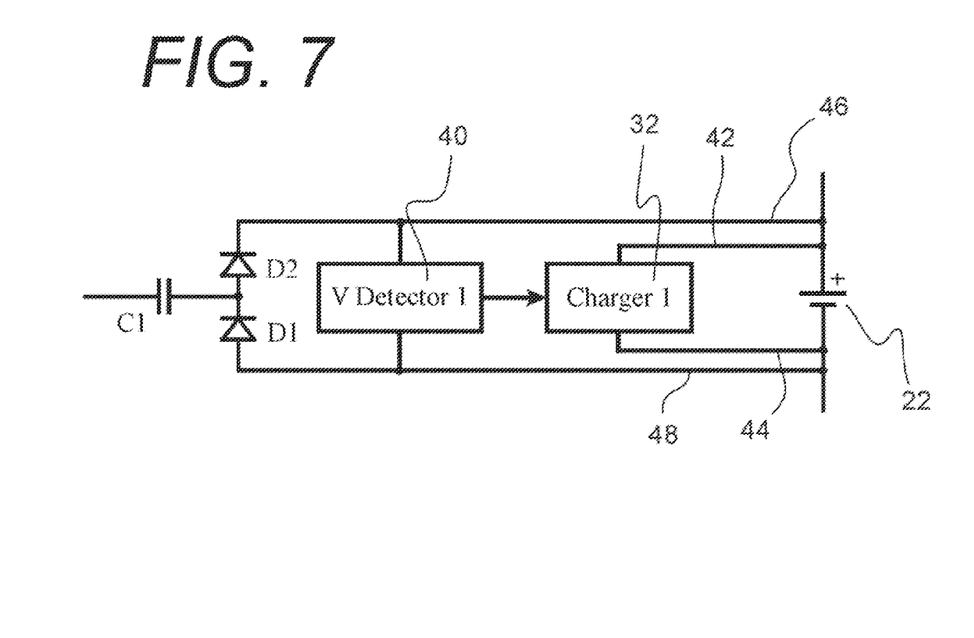
FIG. 7 is an alternative schematic diagram of FIG. 6 including additional wires between the battery cell and the voltage detection and charging module.

An alternative of Module 30 of FIG. 6 is shown in FIG. 7 to have extra wiring and to include a secondary voltage detection circuit 40. Charger 32 is connected to battery cell 22 through wires 42 and 44. And the secondary voltage detection circuit 40 shares the same wiring 46 and 48 with the main detection circuit that includes capacitor C1 and diodes D1 and D2 to connect to battery cell 22. In this way voltage detection by the main voltage detection circuit as illustrated in FIG. 5 or by the secondary voltage detection circuit 40 can detect the voltage of the battery cells 22, 24, 26 and 28 when the cells are being charged without being affected by the voltage drop caused by the charging current. Therefore, the circuit of FIG. 7 can be applied to the cases where cell charging and voltage detection need to happen simultaneously. In FIG. 7, V Detector 40 represents an example that a voltage detection circuit is included in the packaging of charger 32 available to purchase from the market.

Back to FIG. 5, the components that are shared by the voltage detection and cell charging modules, include multiplexer 16, wave generator 12, and Case C detector 14. All these shared components can be packaged together. For example, they can be assembled on a single PCB. Then, the PCB can be placed close to the detection and charging modules, thereby assuring isothermal conditions for accurate temperature compensation.

The number of cells connected together in a battery pack, and measured with the method of this invention is only limited by the voltage ratings of the capacitors used and the required sampling time and frequency, making this technique very powerful. In addition, the low cost of the components associated with each cell allows for economical use with a many cell pack.

It is understood that the above-described invention is merely illustrative of the possible specific embodiments which may represent principles of the present invention. Other arrangements may readily be devised in accordance with these principles by those skilled in the art without departing from the scope and spirit of the invention.

The invention claimed is:

1. A method for detecting a voltage of a rechargeable battery set, comprising the steps of:
    generating a wave form with a positive phase and a negative phase by a current limited square wave generator that is capable of generating square waves having a maximum peak-to-peak voltage when it is not loaded to be current limited;
    sending the positive phase of the wave form to a first loop including a capacitor and the rechargeable battery set, the wave flowing from the capacitor to the positive side of the rechargeable battery set;
    sending the negative phase of the wave form to a second loop including the capacitor, the second loop connecting to the negative side of the battery set, the negative wave flowing from the negative side of the battery set toward the capacitor; and
    detecting a change of an electrical signal from the square wave generator.

2. A method for detecting voltages of battery pack having a plurality of rechargeable battery sets, comprising the steps of:
    performing the steps as recited in claim 1 for each of the plurality of rechargeable battery sets with a shared current limited wave generator; and
    multiplexing the voltage detection of the plurality of battery sets with a multiplexer.

3. The method as recited in claim 2, further comprising the step of:
    setting the maximum peak-to-peak voltage to a predetermined value according a low voltage limit of the battery pack.

4. The method as recited in claim 2, further comprising the steps of:
    setting the maximum peak-to-peak voltage to a predetermined low value; and
    performing the steps as recited in claim 2 while incrementally increasing the maximum peak-to-peak voltage.

5. The method as recited in claim 2 wherein:
    each battery set includes a single battery cell.

6. The method as recited in claim 2 wherein:
    each battery set includes a plurality of battery cells.

7. The method as recited in claim 2 wherein:
    the plurality of battery sets in the battery pack are connected in series.

8. The method as recited in claim 2 wherein:
    the change of a electrical signal is a current limit indicator from low to high.

9. The method as recited in claim 2 wherein:
    the change of a electrical signal is an increase of electrical current.

10. The method as recited in claim 2 wherein:
    the directions of electricity flow in the first loop and the second loop are by means of rectifiers.

11. The method as recited in claim 2 wherein:
    the directions of electricity flow in the first loop and the second loop are by means of diodes.

12. The method as recited in claim 11 wherein:
    the diodes are compensated for temperature change.

13. An apparatus for detecting voltages of a battery pack having a plurality of rechargeable battery cells, comprising:
    a plurality of detection circuits, each matching one of the plurality of rechargeable battery cells, each detection circuit containing a capacitor that is connected to the matching battery cell;
    a current limited square wave generator that is capable of generating wave forms with positive phases and negative phases, the wave forms being square waves with a maximum peak-to-peak voltage when the square wave generator is not loaded to be current limited;

a multiplexer connected to the plurality of detection circuits and to the square wave generator, the multiplexer capable of directing wave forms generated from the square wave generator sequentially to each of the plurality of the detection circuits for voltage detection;

a detector connected to the square wave generator, the detector capable of detecting a change of an electrical signal from the square wave generator; and wherein when wave forms are sent from the square wave generator through the multiplexer to one of the plurality of detection circuits, the positive phases of the wave forms flow a first loop from the capacitor of the detection circuit to the positive side of the matching battery of the detection circuit, and the negative phases of the wave forms flow a second loop from the negative side of the matching battery to the capacitor of the detection circuit.

14. The apparatus as recited in claim 13 wherein:
the maximum peak-to-peak voltage of the square waves is set to a predetermined value according a low voltage limit of the cells in the battery pack.

15. The apparatus as recited in claim 13 wherein:
the maximum peak-to-peak voltage is set to a predetermined initial low value, and to incrementally increase during the process of voltage detection.

16. The apparatus as recited in claim 13 wherein:
the plurality of battery cells in the battery pack are connected in series.

17. The apparatus as recited in claim 13 wherein:
the change of a electrical signal is a current limit indicator from low to high.

18. The apparatus as recited in claim 13 wherein:
the change of a electrical signal is an increase of electrical current.

19. The apparatus as recited in claim 13 wherein:
the directions of electricity flow in the first loop and the second loop are by means of diodes.

20. The apparatus as recited in claim 19 wherein:
the diodes are compensated for temperature change.

* * * * *